United States Patent [19]

Ishibashi et al.

[11] Patent Number: 4,809,055
[45] Date of Patent: Feb. 28, 1989

[54] SEMICONDUCTOR DEVICE HAVING AN ELECTRODE AND A METHOD OF MANUFACTURING THE SAME

[75] Inventors: Masaru Ishibashi, Yokohama; Takeshi Tsubata, Kawasaki; Kazumi Sasaki, Yokohama, all of Japan

[73] Assignee: Kabushiki Kaisha Toshiba, Kawasaki, Japan

[21] Appl. No.: 191,747

[22] Filed: May 5, 1988

Related U.S. Application Data

[63] Continuation of Ser. No. 854,474, Apr. 22, 1986, abandoned.

[30] Foreign Application Priority Data

Apr. 23, 1985 [JP] Japan ................... 60-85489

[51] Int. Cl.$^4$ .................. H01L 23/54; H01L 23/14
[52] U.S. Cl. ........................ 357/71; 357/67; 357/54
[58] Field of Search ............. 357/54, 67, 71, 68

[56] References Cited

U.S. PATENT DOCUMENTS

| 3,763,408 | 10/1973 | Kano et al. | 357/71 |
| 4,210,689 | 7/1980 | Komatsu | 357/54 |
| 4,516,147 | 5/1985 | Komatsu et al. | 357/54 |
| 4,532,004 | 7/1985 | Akiyama et al. | 357/22 |

FOREIGN PATENT DOCUMENTS 4942812 12/1970 Japan.
50-81264 1/1975 Japan.
52-40970 3/1977 Japan .................. 357/54
52-122470 3/1977 Japan.

OTHER PUBLICATIONS

"Method of Minimizing Al-Si Alloying in Semiconductor Devices"-IBM Technical Disclosure Bulletin-vol. 29, No. 10, Mar. 1987, pp. 4626-4627.
"Method of Contacting Shallow Emitters"-Barson-IBM Technical Disclosure Bulletin-vol. 23, No. 9, Feb-1981, pp. 4135-4136.

Primary Examiner—Andrew J. James
Assistant Examiner—Sheila V. Clark
Attorney, Agent, or Firm—Oblon, Fisher, Spivak, McClelland & Maier

[57] ABSTRACT

An $SiO_2$ insulating layer is formed on an Si substrate, and an $Si_3N_4$ insulating layer is formed on the $SiO_2$ layer. A notch is formed in the $Si_3N_4$ layer using a resist film as a mask. The $SiO_2$ layer is etched using the $Si_3N_4$ layer as a mask, thereby forming an opening larger than the notch cut in the $SiO_2$ layer. As a result, the $Si_3N_4$ layer extends over the opening in an overhanging manner When $As^+$ ions are implanted in the periphery of the notch of the $Si_3N_4$ layer, the ion-implanted portion of the $Si_3N_4$ layer is arcuated toward the base region. When a metal such as Ti is deposited on the arcuated portion, the metal is also deposited on the arcuated portion and the portion of the emitter region matching with the notch, thereby forming an emitter electrode portion.

15 Claims, 6 Drawing Sheets

F I G. 4
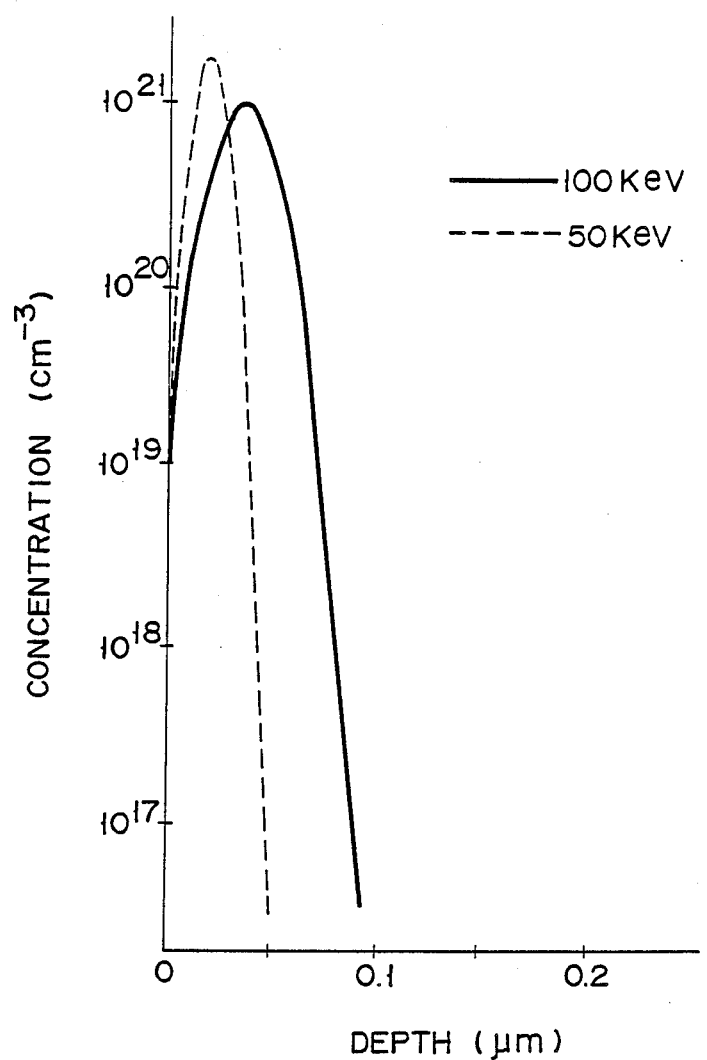

SEMICONDUCTOR DEVICE HAVING AN ELECTRODE AND A METHOD OF MANUFACTURING THE SAME

This application is a continuation of application Ser. No. 06/854,474, filed on Apr. 22, 1986, now abandoned.

BACKGROUND OF THE INVENTION

The present invention relates to a semiconductor device having an electrode, such as a silicon bipolar transistor having an emitter electrode or an overlay type GaAs FET having a gate electrode, and a method of manufacturing the same.

Remarkable is the recent trend that high-frequency semiconductor devices having higher outputs are manufactured. For example, high-output silicon bipolar transistors (hereinafter called transistors) are manufactured by reducing a base width, forming a shallow active region, and micropatterning the pattern. The structure of a contact for an emitter electrode in a transistor greatly influences the characteristics and manufacture of the transistor, including micropatterning the pattern and short-circuiting between the emitter and base.

The structure of a contact for an emitter electrode in conventional transistors, and a method of manufacturing the same will be described with reference to FIGS. 1A and 1B, and FIGS. 2A and 2B. As shown in FIG. 1A, base region 4 is formed on the surface of silicon substrate 2. An element isolation region, an emitter resistor (neither are shown), and the like are also formed on substrate 2. SiO$_2$ film 6 is formed on region 4, and etched by using a resist as a mask, making predetermined opening 8.

Phosphorus is diffused from a POCl$_3$ mass, using film 6 as a mask, thereby forming emitter region 10. PtSi region 12 is formed in region 10 by annealing, in order to decrease a contact resistance. Then, as shown in FIG. 1B, Ti layer 16, Pt layer 18 and Au layer 20 are formed, sequentially one upon another, thereby preparing emitter electrode portion 14.

The width of region 10 can be reduced, to improve high-frequency characteristics are improved. Pt is diffused in an end portion (surrounded by circle 22 in FIG. 1B of region 10 during the forming of layer 12 or during the subsequent annealing. Layer 12 (or portion 14), therefore, tends to be easily short-circuited to base region 4, resulting in a defective product. This is more notable when region 10 is shallow for improving the transistor characteristics.

A second conventional structure of a semiconductor device wherein short-circuiting between layer 12 in region 10 and region 4 is prevented, and a method of manufacturing the device are shown in FIGS. 2A and 2B. The same reference numerals in FIGS. 2A and 2B denote the same portions as in FIGS. 1A and 1B, and a detailed description thereof will be omitted. "Overhang" silicon nitride film 24 is formed on film 6. SiO$_2$ film 6 is overetched using film 24 as a mask, thereby forming opening 26. Emitter region 10 is formed in opening 26 using film 24 as a mask, and layer 12 for reducing the contact resistance is formed therein. Layers 16, 18 and 20 are formed sequentially on film 24, thereby preparing emitter electrode portion 14.

In the second structure, layer 12 and portion 14 are formed at part of the central portion of region 10 and not on a periphery thereof. Therefore, even if Pt is diffused in region 10 during the forming of layer 12 or during the subsequent annealing, it does not reach region 4, and portion 14 and region 4 will not be short-circuited. However, since film 24 is an "overhang", poor step coverage occurs in layer 16 of portion 14. Then, layers 18 and 20 formed on layer 16 contact region 10 through the poor step coverage portion and migrate into region 4, short-circuiting portion 14 and region 4 and degrading the characteristics of the device. To prevent this, opening 26 in film 6 is made larger by overetching, thereby enlarging region 10. In this case, however, the capacitance between regions 10 and 4 increases, inevitably decreasing a power gain and a cut-off frequency.

SUMMARY OF THE INVENTION

It is an object of the present invention to provide a semiconductor device having an electrode wherein short-circuiting between an electrode and a semiconductor substrate, and disconnection of an electrode layer are prevented, and a method of manufacturing the same.

According to the invention, there is provided a semiconductor device having an electrode, comprising:
a semiconductor substrate;
a first insulating layer formed on the semiconductor substrate, the first insulating layer having an opening formed by removing a predetermined region thereof;
a second insulating layer formed on the first insulating layer, the second insulating layer having a notch and an arcuated portion formed by arcuating a periphery of the notch toward the semiconductor substrate which are provided at a position to match with the opening; and
an electrode portion having a first portion formed on the arcuated portion, and a second portion extending through the notch from the first portion to contact the semiconductor substrate.

According to the invention, there is also provided a method of manufacturing a semiconductor device having an electrode, comprising the steps of:
forming a first insulating layer on a semiconductor substrate;
forming a second insulating layer on the first insulating layer, the second insulating layer having an etching velocity lower than that of the first insulating layer;
forming a notch in the second insulating layer;
etching the first insulating layer using the second insulating layer as a mask to remove a region thereof larger than the notch of the second insulating layer, thereby forming an opening;
implanting ions in a region on a periphery of the notch of the second insulating layer to arcuate the periphery of the notch toward the semiconductor substrate, thereby forming an arcuated portion on the periphery of the notch; and
forming an electrode portion on part of the semiconductor substrate matching with the notch, and on the arcuated portion of the second insulating layer.

According to the present invention, the periphery of the notch of the second insulating layer is arcuated toward the semiconductor substrate to form an arcuated portion on the periphery of the notch. Thus, the periphery of the arcuated portion of the notch is close to the semiconductor substrate. Therefore, when an electrode portion is formed on the second insulating layer by deposition or the like, an electrode is formed at a region to match with the notch and to have substantially the same area as the notch. In other words, the electrode portion on the semiconductor substrate extends only slightly from a region corresponding to the notch to a space surrounding the same. As a result, the electrode portion and the base region of a silicon bipolar transistor do not short-circuit in the emitter region. In addition, the emitter region can be small. Since a portion of the electrode portion on the second insulating layer and that on the semiconductor substrate are connected smoothly, even if the electrode portion consists of a plurality of layers, each layer is free from poor step coverage.

BRIEF DESCRIPTION OF THE DRAWINGS

FIG. 4 is a graph showing a concentration distribution of implanted ions;

DETAILED DESCRIPTION OF THE PREFERRED EMBODIMENTS

Figure 1A:
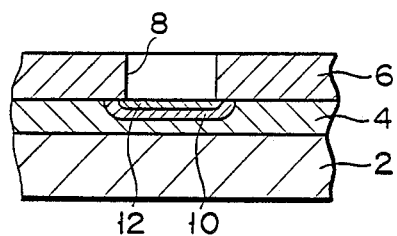
FIGS. 1A and 1B show a structure of a conventional silicon bipolar transistor and a method of manufacturing the same.
Figure 1B:
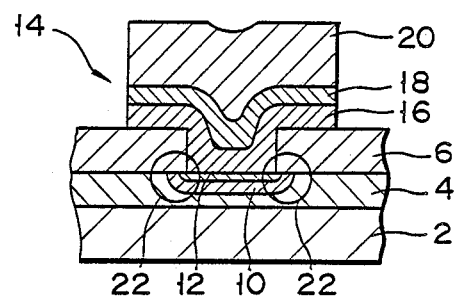
Figure 2A:
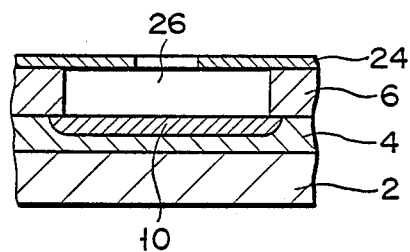
FIGS. 2A and 2B show a structure of another conventional bipolar transistor and a method of manufacturing the same.
Figure 2B:
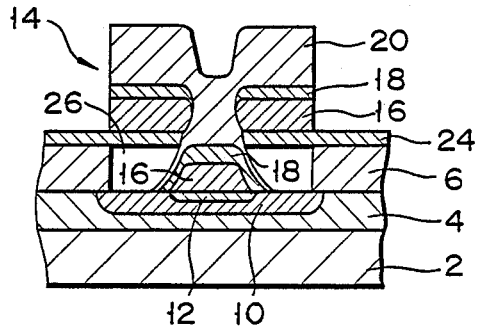
Figure 3A:
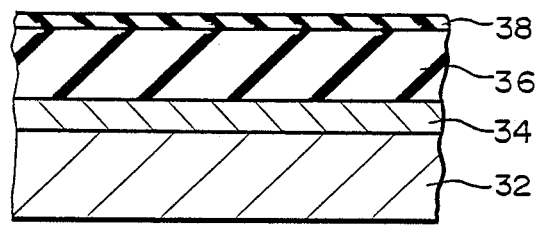
FIGS. 3A to 3D show the steps of manufacturing a silicon bipolar transistor according to an embodiment of the present invention.
Figure 3B:
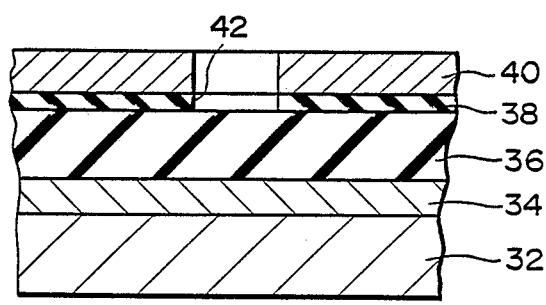
Figure 3C:
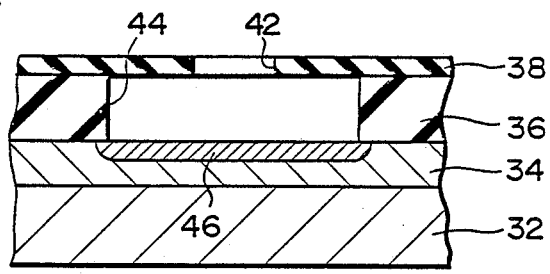
Figure 3D:
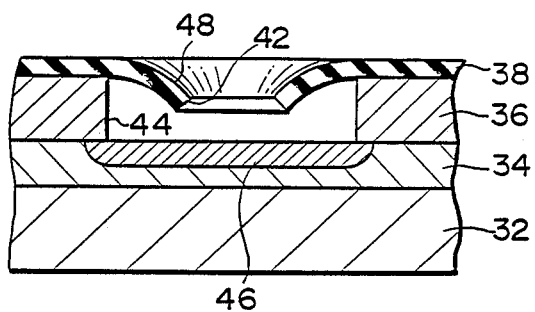
Figure 3E:
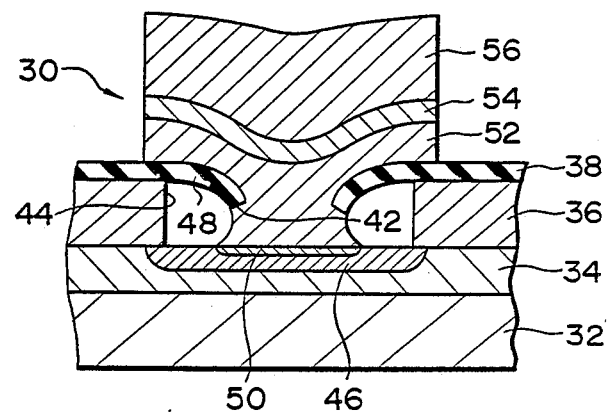
FIG. 3E shows the silicon bipolar transistor of the same.

FIGS. 3A to 3D show the steps of manufacturing silicon bipolar transistor according to an embodiment of the present invention, and FIG. 3E shows transistor. As shown in FIG. 3A, base region 34, in addition to an element isolation region and an emitter resistor (neither are shown), is formed on silicon substrate 32. First insulating layer 36 of $SiO_2$ is formed to a thickness of about 1,500 Å on region 34 by thermal oxidation. Second insulating layer 38 of $Si_3N_4$ is formed to a thickness of about 500 Å on layer 36 by a low pressure chemical vapor deposition (LPCVD) method. Note that, in the case of hydrofluoric acid-based etchant, $Si_3N_4$ has much lower etching velocity than $SiO_2$.

Resist film 40 is formed with a predetermined pattern on layer 38. Layer 38 is etched by plasma etching or the like using film 40 as a mask, thereby forming notch 42 therein.

As shown in FIG. 3C, film 40 is removed, and layer 36 is overetched using a hydrofluoric acid-based etchant and layer 38 as a mask, thereby forming opening 44 larger than notch 42 therein. Layer 38 thus overhangs opening 44. When layer 36, for example, is etched by ammonium fluoride for three minutes, layer 38 overhangs opening 44 by about 0.2 μm. Phosphorus is then diffused in base region 34 opposing opening 44 using phosphorus oxychloride ($POCl_3$), thereby forming emitter region 46.

As shown in FIG. 3D, ions are then implanted on the periphery of notch 42 in layer 38, thereby forming arcuated portion 48. Portion 48 is arcuated such that the periphery of notch 42 opposes region 34 or 46. When ions are implanted in layer 38 for forming portion 48, they are also implanted in layer 34. Therefore, the same n-type impurity as in region 46 is preferably implanted in layer 38. Such ions include As ions.

FIG. 4 shows an ion concentration distribution of a case (indicated by the solid line) where As ions are implanted in layer 38 at an energy of 100 keV, and a case (indicated by the broken line) where As ions are implanted at an energy of 50 keV. The amount of ions implantation is $3 \times 10^{15}$ cm$^{-3}$. As shown in FIG. 4, the As ions are distributed to have their peak concentration value in layer 38. The depth at which the peak value is obtained is a mean range of penetrate RP. As is apparent from FIG. 4, the larger the implantation energy, the deeper the mean range of penetrate RP.

Figure 5:
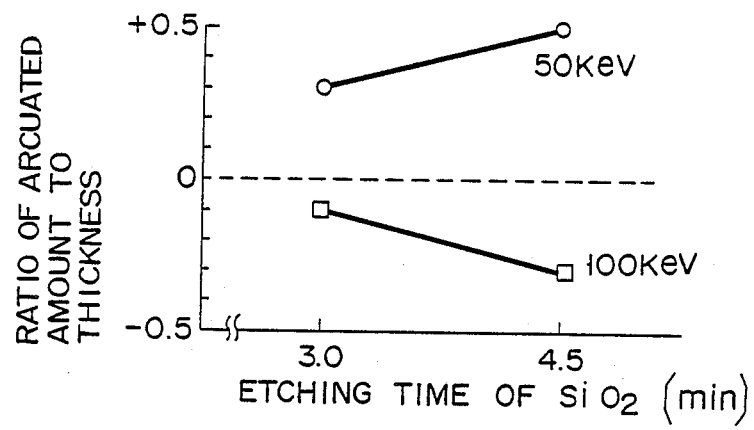
FIG. 5 is a graph showing a relationship between the ion-implantation energy and an arcuated direction of an $Si_3N_4$ layer.

When layer 38 is arcuated toward region 34, energy for ion implantation is set such that the mean range of penetrate RP thereby is more than half the thickness of layer 38. In other words, the ion concentration must have its peak value on the side of region 34 rather than at the central portion of layer 38. FIG. 5 shows the arcuating direction and amount of layer 38 when ions are implanted therein at energies of 50 keV and 100 keV. The amount of implantation is $3 \times 10^{15}$ cm$^{-2}$. In FIG. 5, the axis of ordinate indicates the ratio of the arcuated amount of layer 38 with respect to the thickness (1,500 Å) of layer 36. Positive values represent downward arcuated amounts and negative values represent upward arcuated amounts. The axis of abscissa indicates the etching time of $SiO_2$. When the etching time is 3 minutes, layer 38 overhangs opening 44 by 0.2 μm. As is apparent from FIG. 4, when the acceleration energy is 50 keV, the mean range of penetrate RP is smaller than half the thickness (500 Å) of layer 36, so that layer 38 is arcuated upward; when it is 100 keV, the mean range of penetrate RP is larger than half the thickness there of, i.e., about 360 Å, so that layer 38 is arcuated downward. The larger the amount of overhang of layer 38, the larger the arcuated amount.

Figure 6:
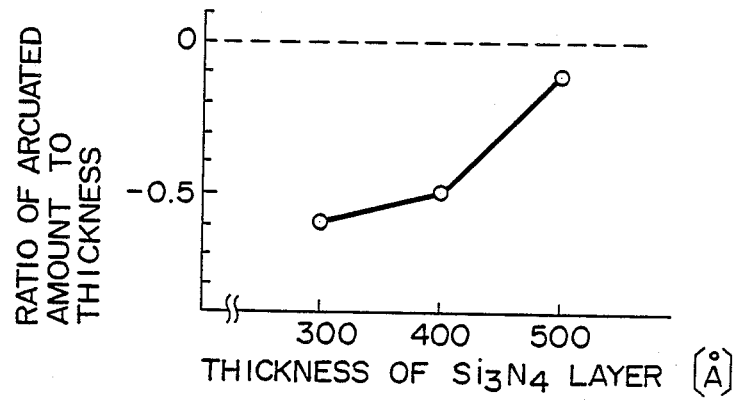
FIGS. 6 and 7 are graphs, respectively, showing a relationship between the thickness of the $Si_3N_4$ layer and the arcuated direction thereof.
Figure 7:
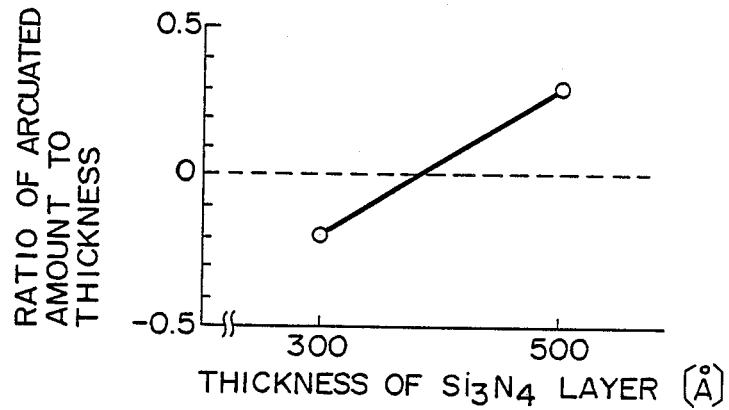

FIGS. 6 and 7 respectively show a relationship between the thickness of layer 38 and the arcuated amount thereof when the amount of implantation is $3 \times 10^{15}$ cm$^{-2}$. In FIG. 6, the etching time of $SiO_2$ is minutes and the ion implantation energy is 100 keV. In FIG. 7, the etching time is 3 minutes, but the ion implantation energy is 50 keV. As is apparent from FIGS. 6 and 7, when the ion implantation energy is 100 keV and when the thickness of layer 38 is 300 to 400 Å, layer 38 is arcuated to half the thickness of layer 36.

After portion 48 is formed in layer 38 in the above manner, electrode portion 30 is formed on portion 48 and region 46, as shown in FIG. 3E. First, a Pt layer with a thickness of about 300 Å is formed on a portion of layer 38 matching with notch 42. The Pt layer is heated to 550° C. to form PtSi layer 50. Then, Ti layer 52, Pt layer 54 and Au layer 56 are formed sequentially using a sputter deposition apparatus or the like. The resultant structure is then patterned by an ion beam milling apparatus or the like, thereby forming emitter electrode portion 30 of a predetermined shape. This completes silicon bipolar transistor having an emitter electrode.

With the above structure and method, since the "overhang" of layer 38 is arcuated to form portion 48, layer 52 constituting portion 30 is formed thereon, preventing poor step coverage. In addition, layers 54 and 56 do not reach region 46 to prevent short-circuiting of portion 30 and region 34 in region 46 and degradation in the characteristics of the device. Opening 44 in layer 36 formed by overetching can be made smaller than conventional "overhang" silicon nitride layer 38. As a result, an increase in the capacitance between regions 46 and 34 due to the widening of region 46 can be prevented, and a power gain and a cut-off frequency are not decreased.

With the conditions for ion implantation of the above embodiment, "overhang" layer 38 is arcuated to a position about half the thickness of layer 36. However, the same effect can be obtained if "overhang" layer 38 is arcuated toward region 34 to a position one third the thickness of layer 36. It should be noted that the distal end of portion 48 (distal end of notch 42) of layer 38 is preferably close to region 46, i.e., the arcuated amount is preferably large. It is ideal that the distal end of portion 48 contact region 46. In this embodiment, emitter region 46 is formed by diffusion of phosphorus using $POCl_3$. However, emitter region 46 is also formed by $As^+$ ion implantation. In this case, diffusion process of phosphorus can be neglected.

Figure 8A:
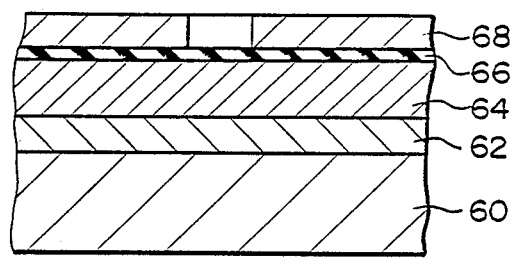
FIGS. 8A to 8D show the steps of manufacturing an overlay GaAs FET according to another embodiment of the present invention.

Another embodiment of the present invention will be described with reference to FIGS. 8A to 8E. FIGS. 8A to 8E show an overlay GaAs Metal Semiconductor Field Effect Transistor (to be abbreviated as GaAs MES FET hereinafter) wherein part of its gate electrode is on its insulating layer, and a method of manufacturing the same. As shown in FIG. 8A, $Si^+$ ions are implanted in semi-insulating GaAs substrate 60 at energies of 50 keV and 200 keV, thereby forming operation layer 62. $SiO_2$ layer 64 with a thickness of about 1,500 Å is formed by a chemical vapor deposition method (to be abbreviated as CVD method hereinafter), and $Si_3N_4$ layer 66 with a thickness of about 400 Å is formed by a plasma CVD method. Then, the resultant structure is annealed at 800° C. for 15 minutes in order to activate the Si. During this annealing, $Si_3N_4$ layer 66 is densified. Photoresist film 68 having a predetermined gate pattern is then formed on layer 66.

Figure 8B:
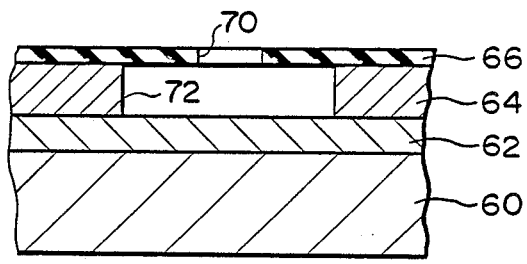
Figure 8C:
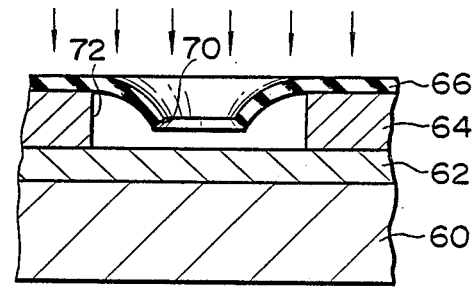

As shown in FIG. 8B, layer 66 is etched by plasma etching using film 68 as a mask, thereby forming layer 66. Layer 64 is etched using a hydrofluoric acid-based etchant such as ammonium fluoride and notch 70 as a mask, thereby forming opening 72.

An overhang portion of layer 66 located above opening 72 is arcuated toward substrate 60 by ion implantation. $As^+$ ions, e.g., are implanted at an acceleration voltage of 100 keV (amount of implantation is $3 \times 10^{15}$ cm$^{-2}$).

Figure 8D:
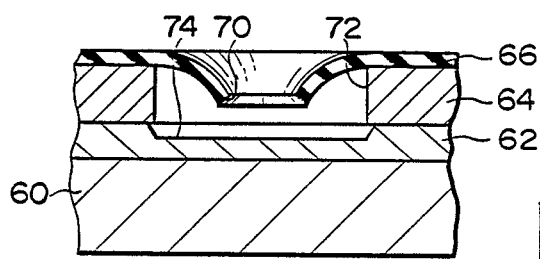

Subsequently, as shown in FIG. 8D, layer 62 is etched by about 700 to 1,000 Å by recess process. Recess 74 is thus formed in a region of layer 62 opposing opening 72. As a result, the portion of layer 62 contaminated by As ion implantation is removed.

Figure 8E:
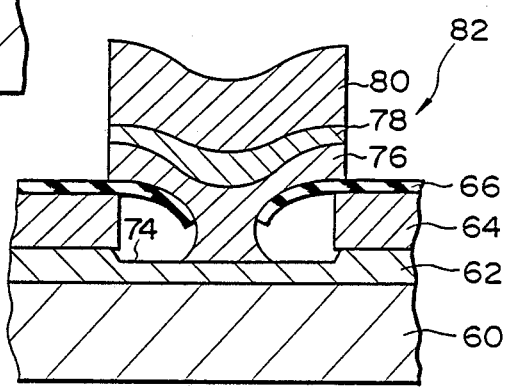
FIG. 8E shows the overlay GaAs FET of the same.

As shown in FIG. 8E, Ti layer 76, Pt layer 78 and Au layer 80 are sequentially formed on layer 62 and on layer 66, thereby completing gate electrode portion 82.

In this embodiment, layer 66 is arcuated toward substrate 60. As a result, layer 76 extends only slightly to a space under layer 66, so that the gate length of portion 82 is not increased. No poor step coverage occurs in any layer of portion 82, so Pt and Au will not contact layer 62 and change the Schottky characteristic. In addition, since overhang $Si_3N_4$ layer 66 is formed, the capacitance between the electrode and the substrate can be reduced.

The structure of a silicon bipolar transistor and an overlay GaAs FET and a method of manufacturing the same according to embodiments of the present invention have been described. However, the present invention is not limited to the above particular embodiments but can be applied to an integrated circuit to offer the same effect as the present embodiments.

What is claimed is:

1. A semiconductor device having an electrode, comprising:
   (a) a semiconductor substrate;
   (b) a first insulating layer formed on the semiconductor substrate, the first insulating layer having an opening formed by removing a predetermined region thereof;
   (c) an impurity region formed on the surface of said semiconductor substrate, said impurity region being aligned with said opening;
   (d) a second insulating layer of $Si_3N_4$ formed on said first insulating layer and having a notch and an arcuated portion, said notch being located substantially in the center of said opening, and said arcuated portion being formed by arcuating a periphery of said notch toward the semiconductor substrate and being doped with an impurity, the impurity concentration having its peak value on the side of the semiconductor, rather than at the central portion of the second insulating layer; and
   (e) an electrode portion having a first portion formed on the arcuated portion and a second portion extending through the notch from the first portion, contacting the semiconductor substrate, and leaving a space under said arcuated portion.

2. The device according to claim 1, wherein said semiconductor device is a silicon bipolar transistor.

3. The device according to claim 2, wherein the semiconductor substrate is a silicon substrate.

4. The device according to claim 3, wherein said first insulating layer is an $SiO_2$ layer formed by thermal oxidation.

5. The device according to claim 4, wherein said second insulating layer is an $Si_3N_4$ layer formed by a low pressure chemical vapor deposition method.

6. The device according to claim 2, wherein said notch is formed by plasma etching using a resist film as a mask.

7. The device according to claim 2, wherein the opening is formed by etching the first insulating layer to be larger than the notch of the second insulating layer with a hydrofluoric acid-based etchant and using the second insulating layer as a mask.

8. The device according to claim 2, wherein the semiconductor substrate comprises an emitter region formed by doping phosphorus in a region opposing the opening.

9. The device according to claim 8, wherein the emitter region is doped by diffusing phosphorus in the semiconductor substrate using phosphorus oxychloride.

10. The device according to claim 1, wherein the arcuated portion is formed by arcuating the second insulating layer toward the semiconductor substrate by ion implantation therein.

11. The device according to claim 10, wherein $As^+$ ions are implanted at an acceleration voltage such that a mean range of penetration of the ions is larger than half a thickness of the second insulating layer.

12. The device according to claim 2, wherein the semiconductor substrate comprises an emitter region formed by doping As+ ions in a region opposing the opening.

13. The device according to claim 12, wherein the emitter region is doped by ion implantation of As+ ions.

14. The device according to claim 2, wherein said electrode portion has a titanium layer formed on the semiconductor substrate and the arcuated portion, a platinum layer formed on the titanium layer, and a gold layer formed on the platinum layer.

15. The device according to claim 1, wherein the semiconductor device is an overlay gallium-arsenide field effect transistor.

* * * * *